US007446528B2

(12) United States Patent
Doddrell et al.

(10) Patent No.: US 7,446,528 B2
(45) Date of Patent: Nov. 4, 2008

(54) COIL ARRAY FOR MAGNETIC RESONANCE IMAGING (75) Inventors: David Michael Doddrell, Westlake (AU); Stuart Crozier, Wilston (AU); Kurt Luescher, Indooroopilly (AU); Wolfgang Udo Roffman, Mount Gravatt East (AU)

(73) Assignee: The University of Queensland, St.. Lucia, Queensland (AU)

( * ) Notice: Subject to any disclaimer, the term of this patent is extended or adjusted under 35 U.S.C. 154(b) by 36 days.

(21) Appl. No.: 10/525,932

(22) PCT Filed: Aug. 29, 2003

(86) PCT No.: PCT/AU03/01116

§ 371 (c)(1),
(2), (4) Date: Oct. 31, 2005

(87) PCT Pub. No.: WO2004/021025

PCT Pub. Date: Mar. 11, 2004

(65) Prior Publication Data
US 2006/0119358 A1 Jun. 8, 2006

(30) Foreign Application Priority Data
Aug. 30, 2002 (AU) .............................. 2002951096

(51) Int. Cl.
*G01V 3/00* (2006.01)
*A61B 5/055* (2006.01)
(52) U.S. Cl. ................. 324/318; 324/309; 324/322; 600/410; 600/411; 600/421; 600/422
(58) Field of Classification Search ......... 324/300–322; 600/407–435; 333/219–235
See application file for complete search history.

(56) References Cited

U.S. PATENT DOCUMENTS 2,267,455 A * 12/1941 Gerhard .................. 174/27

(Continued)

FOREIGN PATENT DOCUMENTS

EP 301 232 B1 2/1995

(Continued)

OTHER PUBLICATIONS

"Scattering Parameters," *Wikipedia, The Free Encyclopedia*, <http://en.wikipedia.org/wiki/Scattering_parameters> (accessed Dec. 15, 2006).

(Continued)

*Primary Examiner*—Brij Shrivastav
*Assistant Examiner*—Tiffany A Fetzner
(74) *Attorney, Agent, or Firm*—Maurice M. Klee (57) ABSTRACT A radio frequency (RF) coil array is used in resonance imaging and/or analysis of a subject located within a cylindrical space in which a magnetic field is operatively applied in an axial direction (z). The coil array comprises a plurality of coil elements (10, 11, 12, 13) angled relative to each other about the axis of the cylindrical space, each coil element having a pair of main conductors extending generally parallel to the direction of the magnetic field and located on diametrically opposite sides of the cylindrical space, and a pair of connection conductors connected between respective ends of the main conductors. Each coil element has its maximum sensitivity near the centre of the cylindrical space, so that the subject under study is located in a region of maximum sensitivity.

16 Claims, 8 Drawing Sheets

U.S. PATENT DOCUMENTS

| | | | |
|---|---|---|---|
| 2,516,500 A * | 7/1950 | Alford | 343/705 |
| 2,994,084 A * | 7/1961 | Miller | 343/783 |
| 2,996,658 A * | 8/1961 | Kirchner et al. | 324/310 |
| 2,999,978 A * | 9/1961 | Pinkley | 324/322 |
| 3,100,892 A * | 8/1963 | Cutler | 342/353 |
| 3,260,844 A * | 7/1966 | Shipley et al. | 250/299 |
| 4,686,473 A | 8/1987 | Chesneau et al. | |
| 4,763,074 A * | 8/1988 | Fox | 324/318 |
| 4,799,016 A | 1/1989 | Rezvani | |
| 4,825,162 A | 4/1989 | Roemer et al. | |
| 4,833,409 A | 5/1989 | Eash | |
| 6,411,090 B1 | 6/2002 | Boskamp | |
| 6,590,392 B2 * | 7/2003 | Boskamp et al. | 324/318 |
| 6,768,302 B2 | 7/2004 | Vester | |
| 6,870,368 B2 * | 3/2005 | Visser et al. | 324/318 |
| 6,900,636 B2 * | 5/2005 | Leussler | 324/318 |
| 6,930,481 B2 * | 8/2005 | Okamoto et al. | 324/318 |
| 6,998,843 B2 * | 2/2006 | Okamoto et al. | 324/318 |
| 7,109,713 B2 * | 9/2006 | Okamoto et al. | 324/318 |
| 2002/0125888 A1 * | 9/2002 | Visser et al. | 324/318 |
| 2002/0149367 A1 * | 10/2002 | Boskamp et al. | 324/318 |
| 2003/0094948 A1 * | 5/2003 | Okamoto et al. | 324/318 |
| 2004/0155656 A1 * | 8/2004 | Leussler | 324/318 |
| 2005/0122113 A1 * | 6/2005 | Okamoto et al. | 324/318 |
| 2005/0264292 A1 * | 12/2005 | Okamoto et al. | 324/318 |
| 2006/0119358 A1 * | 6/2006 | Doddrell et al. | 324/318 |
| 2006/0181279 A1 * | 8/2006 | Okamoto et al. | 324/318 |

FOREIGN PATENT DOCUMENTS

| | | |
|---|---|---|
| EP | 1 298 446 A2 | 4/2003 |
| WO | WO 03/038460 | 5/2003 |
| WO | WO 03/107027 | 12/2003 |
| WO | WO 2004/001435 | 12/2003 |

OTHER PUBLICATIONS

Callaghan, P. T., *Principles of Magnetic Resonance Microscopy*, Oxford University Press, 1994.

Meyer, et al., "Fast Spiral Coronary Artery Imaging," *Magn. Reson. Med.*, 1992, 28:202-213.

Pipe, J. G., "Turboprop-an improved Propeller Sequence for Diffusion Weighted MRI," *Proc. Intl. Soc. Magn. Reson. Med.*, 2002, 10:435.

Porter, et al., "16-element phased array head coil," *Magn. Reson. Med.*, 1998, 40:272-279.

Pruessmann, et al., "Sense: sensitivity encoding for fast MRI," *Magn. Reson. Med.*, 1999, 42:952-962.

Roemer, et al., "The NMR Phased Array," *Magn. Reson. Med.*, 1990, 16:192-225.

Sodickson, et al., "Simultaneous acquisition of spatial harmonics (SMASH): fast imaging with radiofrequency arrays," *Magn. Reson. Med.*, 1997, 38: 591-603.

* cited by examiner

FIG. 1

(Prior Art)

COIL ARRAY FOR MAGNETIC RESONANCE IMAGING

CROSS REFERENCE TO RELATED APPLICATION

This application is the U.S. national phase under 35 USC §371 of International Application No. PCT/AU2003/001116 filed on Aug. 29, 2003, which was published in English under PCT Article 21(2) on Mar. 11, 2004 as International Publication No. WO 2004/021025.

This invention relates to a coil arrangement for resonance systems. In particular, the invention is directed to a phased array coil structure, suitable for use in magnetic resonance imaging, which provides improved sensitivity closer to the centre of the object undergoing imaging.

BACKGROUND TO THE INVENTION

In magnetic resonance imaging (MRI) applications, a patient is placed in a strong and homogeneous static magnetic field, causing the otherwise randomly oriented magnetic moments of the protons, in water molecules within the body, to precess around the direction of the applied field. The part of the body in the homogeneous region of the magnet is then irradiated with radio-frequency (RF) energy, causing some of the protons to change their spin orientation. This has the effect of nutating the net magnetization, which was directed with the static magnetic field prior to RF application, and thereby causing a component of the magnetization to be transverse to the applied static field. This precessing magnetization induces measurable signal in a receiver coil tuned to the frequency of precession (The Larmor frequency). This is the magnetic resonance (MR) signal. The useful RF components are those generated in a plane at 90 degrees to the direction of the static magnetic field.

The same coil structure that generates the RF field can be used to receive the MR signal or a separate receiver coil place close to the patient may be used. In either case the coils are tuned to the Larmor precessional frequency $\omega_0$ where $\omega_0 = \gamma B_0$ and $\gamma$ is the gyromagnetic ratio for a specific nuclide and $B_0$ is the applied static magnetic field.

Conventionally, when imaging the thorax, a whole body radio frequency coil is used in both transmit and receive modes to enable full coverage of the anatomy. By distinction, when imaging the head, neck, knee or other extremity, local coils are often used as receivers in conjunction with whole-body transmitter coils. Placing the local coil close to the imaged region improves the signal-to-noise ratio and therefore the spatial resolution as well as limiting the field of view. In some procedures, local coils are used for both transmission and reception.

In some cases, a plurality of RF receiver coils forming an NMR phased array are used to enable MR signals from multiple regions in the body to be acquired at the same time (see for example U.S. Pat. No. 4,825,162). In this manner parallel imaging methods may be used to advantage in tailoring the region of interest and/or reducing scan times for comparable resolution to single receiver systems. Popular parallel imaging methods include "SMASH" (D K Sodikson and W F Manning, "Simultaneoaus acquisition of spatial harmonics (SMASH): fast imaging with radiofrequency arrays," Magn. Reson. Med. 38:591-603, 1997) and "SENSE" (K P Pruessmann, M. Weigner, M B Scheidegger and P. Boesinger, "SENSE: sensitivity encoding for fast MRI," Magn. Reson. Med. 42; 952-962, 1999).

In prior art phased array coils, the multiple receiver coils are arranged linearly in a plane, or can be wrapped circumferentially around a cylinder or similar shape. They are wrapped in a serial fashion, that is one coil after the other. The coils are placed either overlapping or adjacent to each other to eliminate their coupling. (See for example, J R Porter, S M Wright and A Reykowski, "16-element phased array head coil," Magn. Reson. Med. 40: 272-279, 1998).

While these coils have been effective in producing complete images of an anatomical region, such as the brain, by combining signals from each of the array elements, it is a characteristic of all such prior art coil arrangements that the point of maximum sensitivity of each element is superficial to the anatomy under study. Often the area of diagnostic interest, in the head, for example, may be located away from the surface, deeper in the brain.

It is an object of the invention to provide an improved coil array in which each coil element has its maximum sensitivity close to the centre of the object under study.

It is a further object of the invention to provide a rotary switched phased array radio frequency structure.

BRIEF SUMMARY OF THE INVENTION

In one broad form, the invention provides a radio frequency (RF) coil array configured for use in magnetic resonance imaging and/or magnetic resonance analysis of a subject located within an imaging space in which a static magnetic field is operatively applied in a first direction, the RF coil array comprising a plurality of individual coil elements angled relative to each other and electrically separate from each other, each individual coil element having a pair of main conductors extending generally parallel to the direction of the magnetic field and located on opposite sides of the imaging space, and a pair of connection conductors connected between respective ends of the main conductors, said connection conductor being generally transverse to the first direction.

As can be seen in FIGS. 3, 4, 5, 6, and 8, in addition to being on opposite sides of the imaging surface in which the static magnetic field is applied, the main conductors of each individual coil element are also located in a single plane that passes through the middle of the imaging space so that each individual coil element has its maximum sensitivity close to the centre of the subject. For example, in FIG. 3, the main conductors of coil element 10 are located in a first plane and the main conductors of coil element 11 are located in a second plane which, in this case, is orthogonal to the first plane. Similar single planes for the main conductors of each individual coil element are shown in FIGS. 4, 5, 6, and 8. As shown in FIGS. 3, 4, 5, 6, and 8, the connection conductors are generally transverse to the direction (i.e. the first direction) in which the static magnetic field is applied.

The main conductors normally carry equal currents but in opposite directions.

Typically, the space is a cylindrical space and the main conductors extend axially and are located diametrically opposite each other. The coil elements are therefore located in respective diametrical planes of a cylinder, and spaced angularly around the axis of the cylinder. Preferably, the elements are spaced equally.

Each coil element has its maximum sensitivity close to the centre of the object under study.

For practical purposes, the connection conductors at one or both ends of the coil element may be positioned around the circumference of the cylinder to provide access to within the cylinder. The coil elements can be wound from a length of wire in a suitable manner.

In one embodiment of the invention, each element is a receiver coil individually connected to a pre-amplifier and receiver channel, and actively decoupled from a larger volume transmitter coil. Signals from each of the elements are later combined to form a composite image.

In another embodiment of the invention, each element is used for both transmission of RF energy and reception of the magnetic resonance signal.

In a still further embodiment, selected elements may be used for transmission and different elements for reception, the selection of said transmission and reception elements may change desirably during an imaging sequence. For example, the coil elements can be arranged in one or more orthogonal pairs, one coil element in each pair being adapted for use as a transmitter coil and the other coil element in each pair being adapted for use as a receiver coil. As the coils are orthogonal, there is negligible coupling between them. Each orthogonal coil pair is sequentially activated. A receiver channel is switched to the receiver coil of the active orthogonal pair.

Such rotary switched phased array structures may be used to advantage in routine imaging sequences or with imaging sequences that sample the imaging region using rotary "k-space" techniques, such as back-projection or Propeller (J. G. Pipe, "Turboprop—an improved Propeller Sequence for Diffusion Weighted MRI" *Proc. Intl. Soc. Magn. Reson. Med.* 10, 435 (2002)) sequences and, in these circumstances, are particularly advantageous for the imaging of short $T_2$ relaxation constant materials.

In order that the invention may be more fully understood and put into practice, preferred embodiments thereof will now be described, by way of example only, with reference to the accompanying drawings.

DETAILED DESCRIPTION OF THE INVENTION

Figure 1:
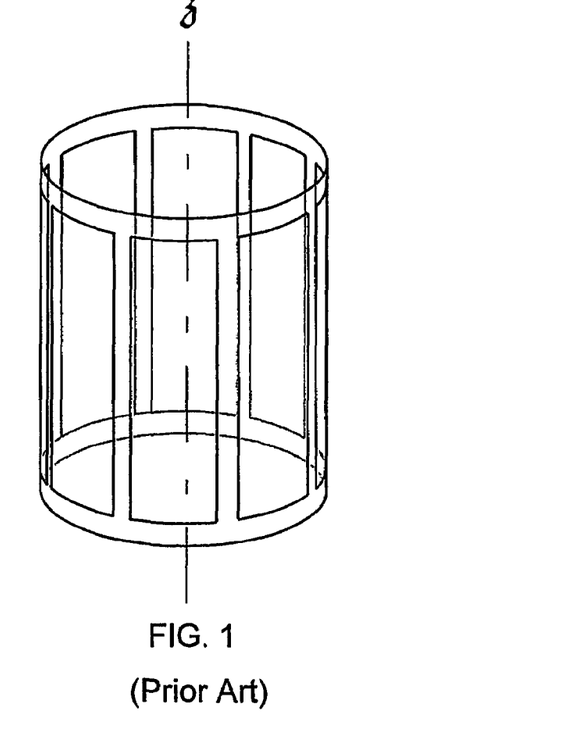
FIG. 1 shows a prior art "birdcage" coil array in cylindrical form.

FIG. 1 shows a prior art MRI phased array general coil layout, in which the coil elements are placed adjacent or partially overlapping around the outside of a cylinder (not shown) or similarly shaped former. That is, the coil elements are located on the circumferential surface of a cylinder. As is routine in the prior art, a single large resonator, external to the array transmits radiofrequency energy to a patient undergoing an MRI scan within the array. Each element of the array acts as a receiver coil, and all coils generally receive signal simultaneous, thereby enabling parallel acquisition of signals from regions within the cylinder.

Figure 2:
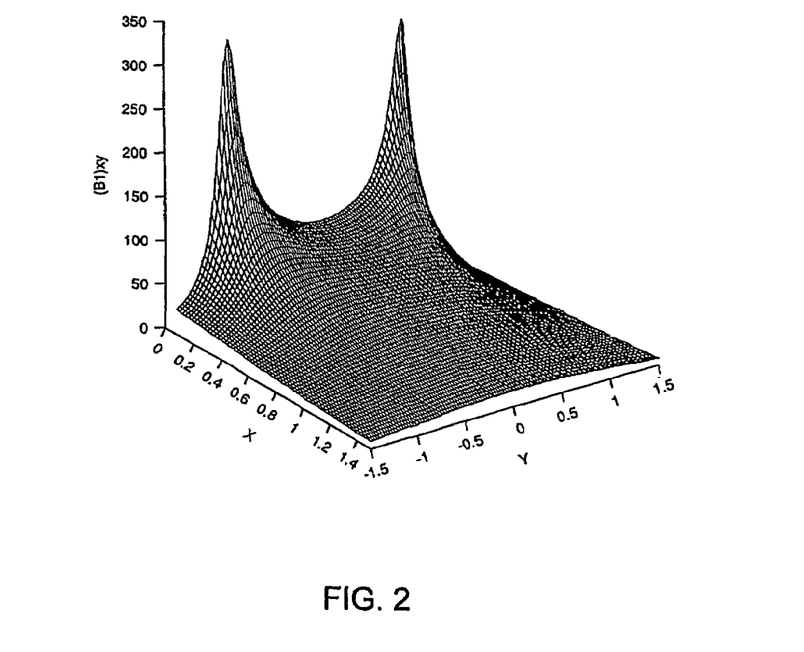
FIG. 2 shows the sensitivity profile of a single prior art array element, with the circular coil centre being located at X=Y=0.

As is known in the art (see for example, P. Roemer, W. A. Edelstein, C. E. Hayes, S. P. Souza and O. M. Mueller, "The NMR Phased Array," *Magn. Reson. Med.* 16, 192-225 (1990)), the interaction between the coils may be reduced by overlapping the coils in a prescribed manner, connecting low-impedance pre-amplifiers to each coil and/or having a common conductor containing a predefined capacitor; or a combination of these three methods. A typical sensitivity profile of a single element of the prior art coil array is shown in FIG. 2, where it is clear that the region of high sensitivity is close to the plane of the coil and falls away rapidly away from the coil plane.

In contradistinction, in the present invention, each of the elements of the coil array forms a circuit which has a plane of maximum sensitivity that generally contains the axis of the cylinder. That is, the plane of each element cuts radially or diametrically through the cylinder rather than wrapping circumferentially around it, as in the prior art. This is advantageous in that the region of maximum sensitivity is central rather than peripheral to the object being imaged. This is often preferable in a diagnostic sense.

Figure 3:
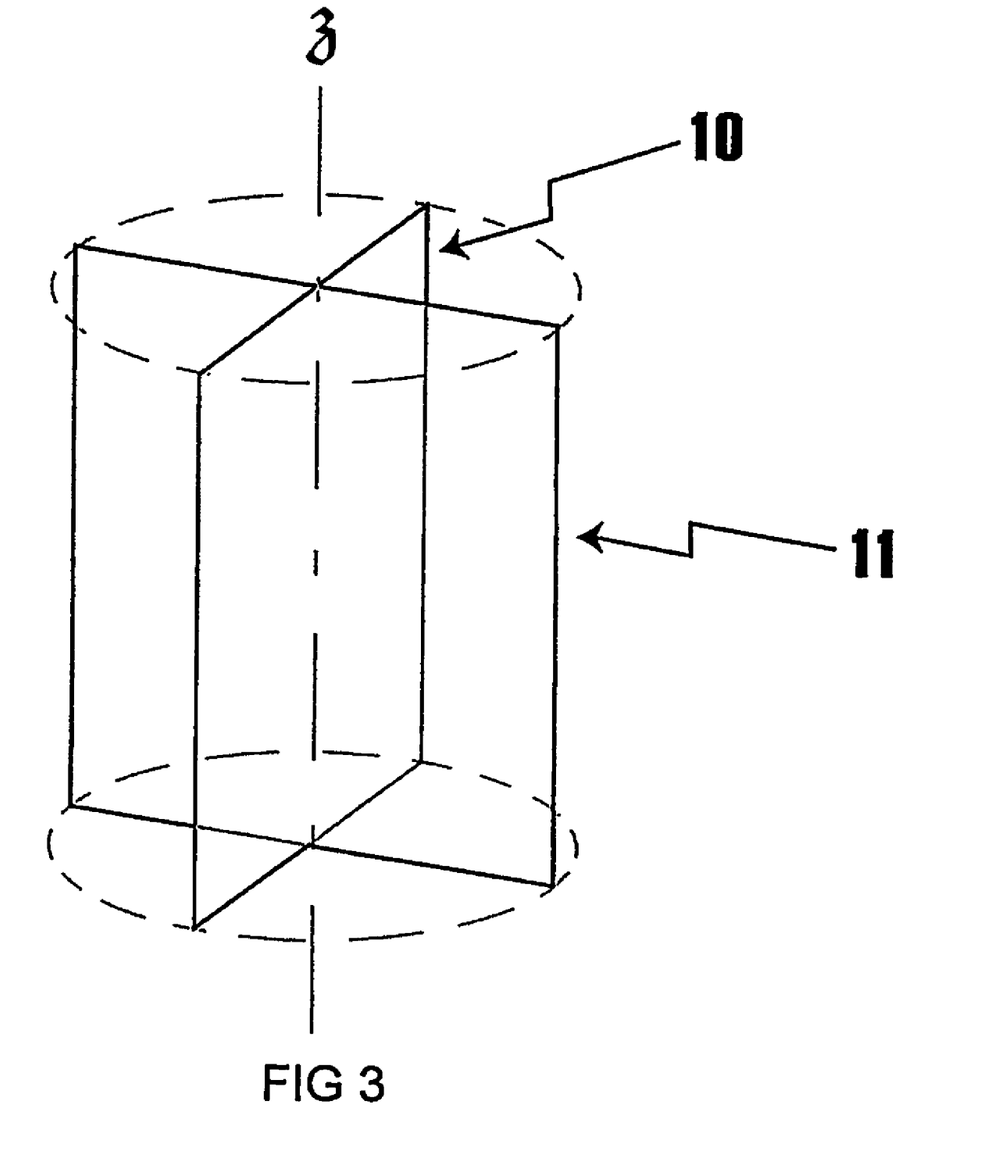
FIG. 3 is a schematic diagram illustrating a two element coil array, according to one embodiment of the invention.

FIG. 3 illustrates conceptually or schematically, the orientation of a 2-element rotary or angular array according to one embodiment of the invention. In an N-element array, each coil element is rotated or angled from the nearest element by 180/(N) degrees, i.e. they are spaced equi-angularly around the cylinder. For example, elements 10 and 11 are separated by 90 degrees.

Figure 4:
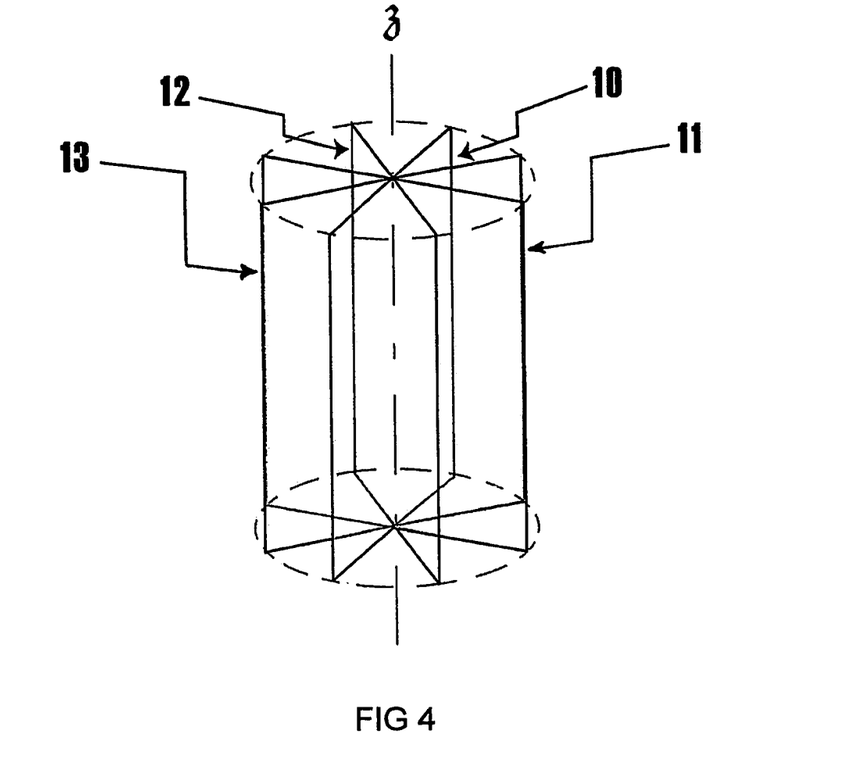
FIG. 4 is a schematic diagram illustrating a four element coil array, according to another embodiment of the invention.

FIG. 4 shows an example of a 4-element array, in which each of the coil elements 10,11,12 and 13 are separated from the nearest element by 45 degrees. It is to be understood that the invention also encompasses the use of unequal angular spacing of the elements.

Figure 5:
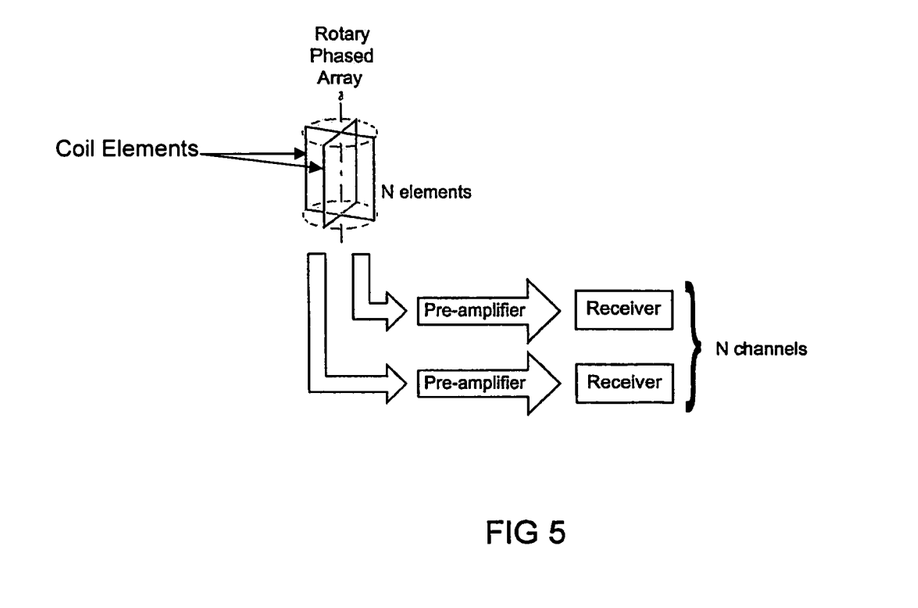
FIG. 5 is a schematic diagram illustrating the general connectivity of the coil array of FIG. 3 when used for parallel imaging.

Each of the elements of the array are tuned to the appropriate Larmor precessional frequency and, in a preferred embodiment, are connected to separate preamplifiers and receiver channels, so that each of the elements can acquire signal simultaneously, as is illustrated in the schematic block diagram of FIG. 5.

In another embodiment of the invention, one of the coil elements of the array acts as a transmitter element and all others as receiver elements. Alternately, each of the elements may act as both transmitter and receiver.

In a further embodiment, a selected pair of orthogonal coil elements (elements 10 and 12 in FIG. 4, for example) act as a transmitter receiver pair, where one element transmits, say element 10 and the other (element 12) receives, with all other elements inactive. Then, sequentially, the next rotary orthogonal pair act as transmitter/receiver (elements 11 and 13) and so on through the set of N elements. The receiver channel is sequentially switched to the particular active receiver coil element.

When employed as transmitter coils, each element can be driven with a different amplitude and phased radiofrequency pulse, so as, for example, to generate circularly polarized transmission radiofrequency fields. Such tailoring of radio frequency drives is also useful in high frequency applications to correct for the propagation distortions caused by the dielectric and conductive nature of human tissue. By appropriately driving the rotary elements these non-symmetric effects can be largely compensated, resulting in images that give a more accurate representation of the patient's anatomy.

The rotary progression or acquisition in this manner can be closely linked to MRI imaging techniques. In these sequences, the way in which the imaging gradients are used to scan the imaging region is angular or rotary rather than rectilinear in so-called "k-space" (see, for example, P. T. Callaghan, Principles of Magnetic Resonance Microscopy, Oxford University Press, 1994). Such imaging methods that sample imaging space in a rotary manner include back-projection imaging methods, "propeller" sequences and some variants of spiral imaging (C. H. Meyer, B. S. Hu, D. G. Nishimura, A. Macovski, "Fast Spiral Coronary Artery Imaging" Magn. Reson. Med. 28, 202-213, 1992).

While not limited to use with these sequences, the rotary phased array is advantageous in speeding up these types of imaging protocols.

While FIGS. 3-5 illustrate the general principles of the rotary array of this invention, the coil structures need to allow patient access to be useful in practice. The conductors of each element parallel with the z-axis and positioned on the periphery of the cylinder are called the main conductors of each coil element, and the other two conductors which connect these main conductors and complete the coil element are called connection conductors. The connection conductors of each coil element at one or both of the ends of the structure (i.e., the planes orthogonal to the z-axis at the furtherest extents of the array being the top and bottom ends), are placed around the circumference of the cylinder. This allows complete access at one or both ends and is, for example, a structure useful for head imaging.

Figure 6:
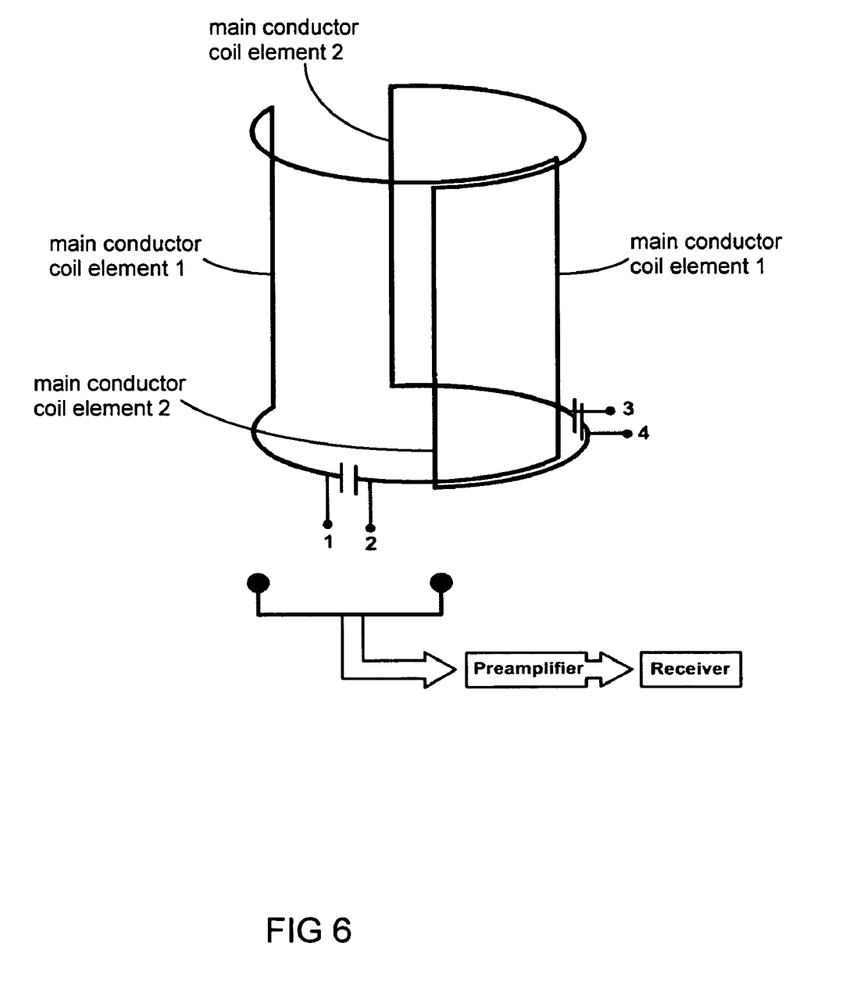
FIG. 6 is a schematic diagram illustrating a coil array with complete cylindrical access.

FIG. 6 illustrates schematically a structure in which the connection conductors of all coil elements are positioned around the circumference of the cylinder at both the top and bottom ends of the array, thus allowing complete cylindrical access to the patient. In this example, switch points A and B may be alternately connected to points 1 & 2 then 3 & 4, or each of the elements may be permanently connected to respective separate pre-amplifiers and receiver channels as shown schematically in FIG. 5.

Positioning the connection conductors around the periphery should not affect the field unduly. The transverse field is the useful RF field for MRI applications, and since this is generated primarily by conductors running parallel to the main axis (i.e., the main conductors), the strongest field is in the middle of the cylinder if the main conductors are diametrically opposite each other on the periphery of the cylinder.

Typically in prior art elements, any overlap between adjacent coils is small—just enough to minimize mutual inductance. In the prior art, when there are just 2 elements, they are wrapped around the periphery. So the main conductors of one element are close or adjacent to the main conductors in the other element. In the invention, they would still be 90 degrees apart. Furthermore, as the number of elements increases, in prior art coils the maximum sensitivity moves closer to the periphery of the cylinder. On the other hand, with the coil arrangement of the invention, as the number of elements increases, maximum sensitivity remains near the centre of the cylinder.

To demonstrate a preferred embodiment of the present invention, a 4-element transmit/receive rotary array was constructed around a cylinder of diameter 64 mm and length 110 mm. Each element was tuned and matched to operate simultaneously at 85 MHz (corresponding to $^1$H Magnetic Resonances at 2 Tesla field strength) and decoupled from each other.

Figure 7:
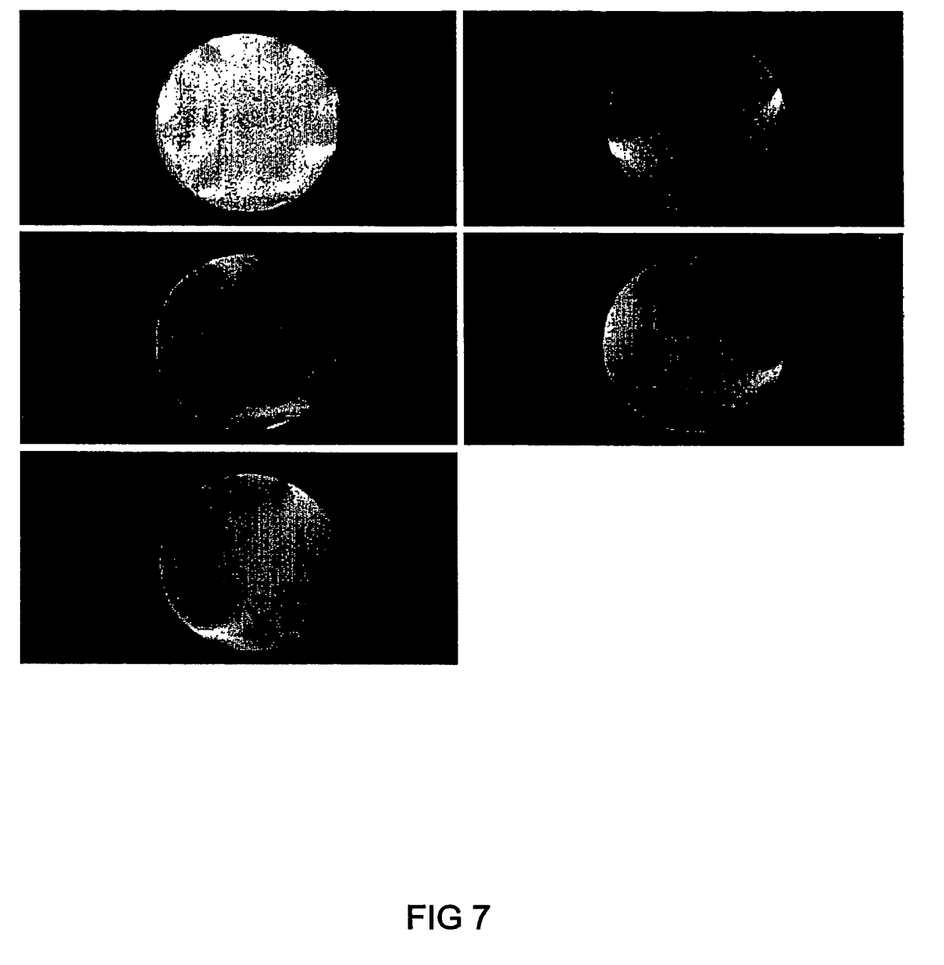
FIG. 7 is a series of images of a silicon oil cylindrical phantom, acquired using a prototype rotary array coil. The image at the top left is the sum-of-squares image combination of the images from the 4 elements (depicted in the other images).

FIG. 7 shows the transmit/receive images from each of the 4 rotary elements in turn, and a sum-of-squares combined image (at the top right) which demonstrates a high uniformity of signal across the imaging region, particularly in the central region as desired.

Figure 8:
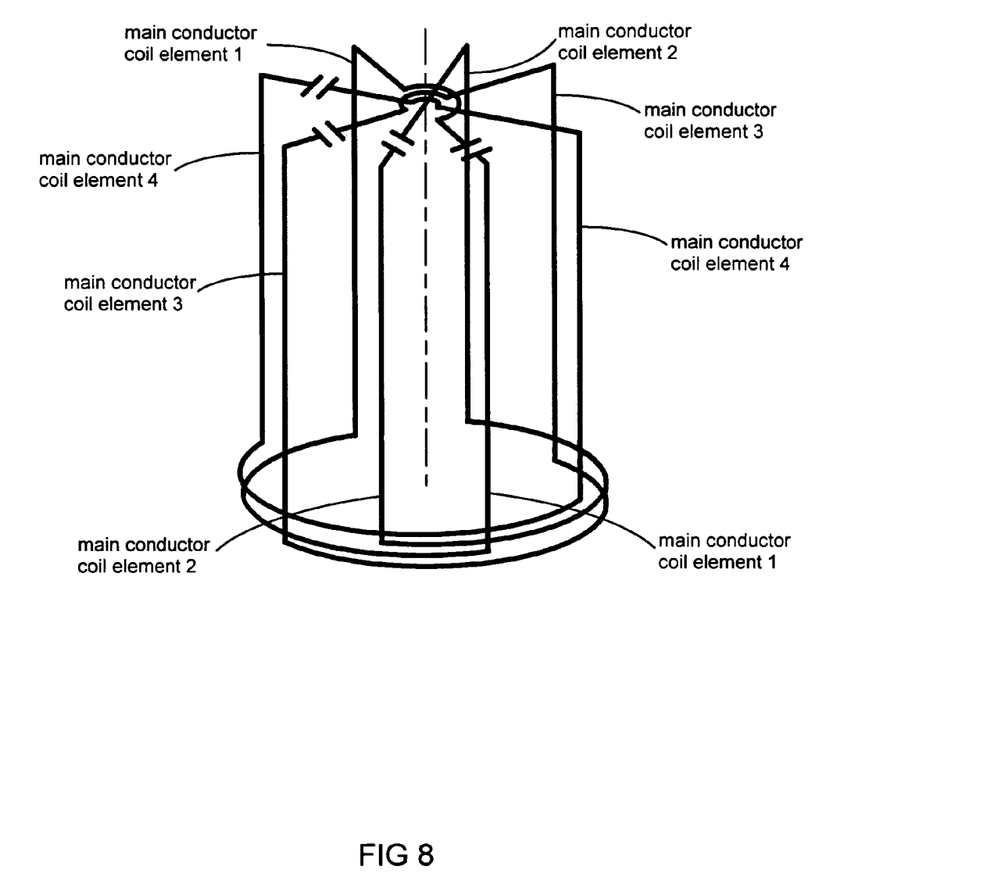
FIG. 8 is a schematic diagram of another embodiment of the coil array illustrating a capacitor arrangement which assists with element isolation.
Figure 9A:
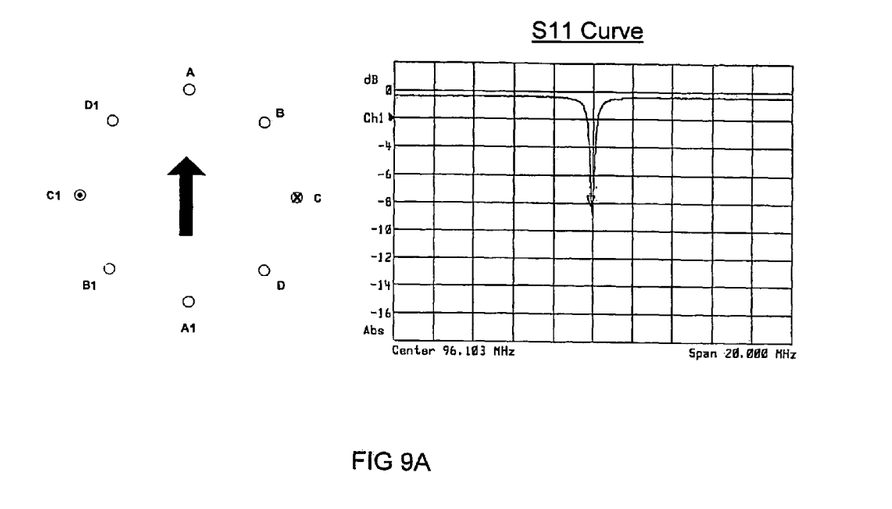
FIGS. 9A to 9D show S11 curves for the respective coil elements in the array of FIG. 8 when all other coil elements were simultaneously tuned.
Figure 9B:
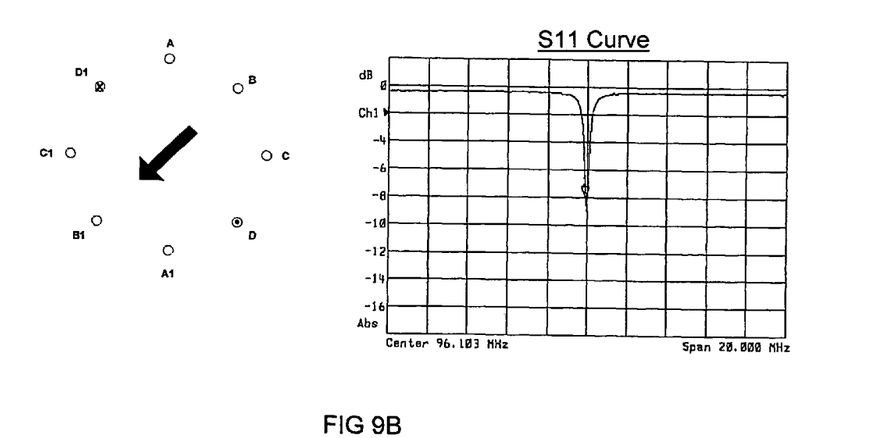
Figure 9C:
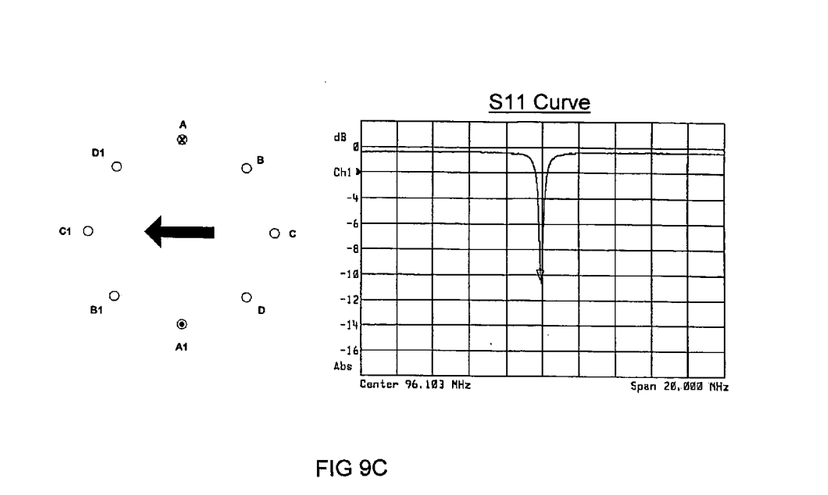
Figure 9D:
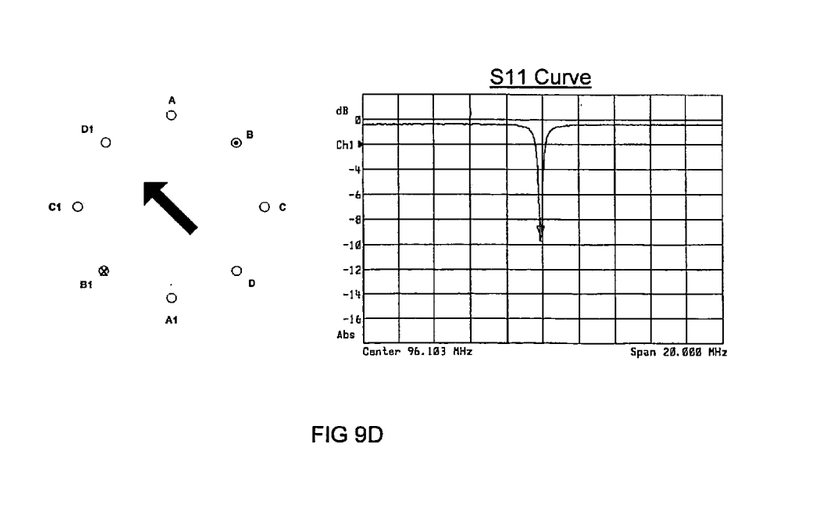

FIG. 8 illustrates an embodiment of the invention in which the elements are used for simultaneous parallel acquisition, the placement of the capacitors and the nature of interconnections assisting with element isolation which is an important consideration for multi-element arrays.

FIGS. 9A to 9D demonstrate the isolation between coil elements of FIG. 8. In this example, all coil elements were tuned to the same resonant frequency and were inductively excited as indicated by the arrows on the left of each figure. The S11 curves on the right of the respective figures indicate that in all cases the elements are very well isolated and unaffected by the proximity of the other tuned elements. If substantive coupling were evident, the S11 curves would not be of the shape indicated but would have a dual minima or a 'splitting' of the curve. Such splitting is known to those skilled in the art to indicate substantive coupling.

The foregoing embodiments are illustrative only of the principles of the invention, and various modifications and changes will readily occur to those skilled in the art. The invention is capable of being practiced and carried out in various ways and in other embodiments. It is also to be understood that the terminology employed herein is for the purpose of description and should not be regarded as limiting.

As such, those skilled in the art will appreciate that the invention is not limited to the exact constructions and operation shown and described, but includes all suitable modifications and equivalents within the scope of the claims which are to be regarded as including such equivalent constructions insofar as they do not depart from the spirit and concept of the invention.

The invention claimed is:

1. A radio frequency (RF) coil array configured for use in magnetic resonance imaging and/or magnetic resonance analysis of a subject located within a space in which a homogeneous static magnetic field is operatively applied in a first direction, the RF coil array comprising:
   a plurality of individual coil elements angled relative to each other, with each of the individual coil elements (i) being electrically separate from each of the other individual coil elements, and (ii) having a pair of main conductors extending generally parallel to the first direction and located on opposite sides of the space in a single plane, said single plane passing through the middle of the space; and
   a connection conductor connected between respective ends of the main conductors, said connection conductor being generally transverse to the first direction.

2. An RF coil array as claimed in claim 1, wherein the homogeneous space is a cylindrical space.

3. An RF coil array as claimed in claim 2 wherein the individual coil elements are equi-angularly spaced about the axis of the cylindrical space, the angle between adjacent coil elements being 360/N, where N is the number of coil elements in the array.

4. An RF coil array as claimed in claim 2, wherein the connection conductor extends around the periphery of the cylindrical space at an axial end thereof in order to thereby permit access to the cylindrical space through that end.

5. An RF coil array as claimed in claim 2, wherein the individual coil elements are arranged in one or more orthogonal pairs with respect to one another.

6. A magnetic resonance imaging apparatus comprising:
a magnet configured for applying a homogeneous static magnetic field in a first direction within an imaging space configured for receiving a subject to be imaged;
a radio frequency (RF) coil array comprising a plurality of angularly spaced individual coil elements, each individual coil element being electrically separate from each of the other individual coil elements;
each individual coil element comprising:
  a pair of main conductors extending generally parallel to the first direction and located on opposite sides of the imaging space in a single plane, said single plane passing through the middle of the imaging space; and
  a connection conductor connected between respective ends of the main conductors, said connection conductor being generally transverse to the first direction.

7. A magnetic resonance imaging apparatus as claimed in claim 6, wherein the imaging space is a cylindrical space.

8. A magnetic resonance imaging apparatus as claimed in claim 7, wherein the individual coil elements are equi-angularly spaced about the axis of the cylindrical space, the angle between adjacent individual coil elements being 360/N, where N is the number of individual coil elements in the array.

9. A magnetic resonance imaging apparatus as claimed in claim 7, wherein the connection conductor extends around the periphery of the cylindrical space at an axial end thereof in order to thereby permit access to the cylindrical space through that axial end.

10. A magnetic resonance imaging apparatus as claimed in claim 7, wherein the individual coil elements are arranged in one or more orthogonal pairs with respect to one another.

11. A magnetic resonance imaging apparatus as claimed in claim 6, wherein each individual coil element is used as a receiver coil, the magnetic resonance imaging apparatus further comprising:
  a plurality of receiver channels each connected to a respective individual coil element, and
  a means for combining the signals from each individual coil element in order to form a composite MRI image of the subject.

12. A magnetic resonance imaging apparatus as claimed in claim 6, wherein at least one individual coil element is utilized as both a transmitter and receiver coil.

13. A magnetic resonance imaging apparatus as claimed in claim 6, wherein the individual coil elements are arranged in one or more orthogonal pairs, the individual coils elements of a pair being orthogonal with respect to one another, one individual coil element in each orthogonal pair being utilized as a transmitter coil and the other individual coil element in each orthogonal pair being utilized as a receiver coil, each orthogonal pair being sequentially active, the magnetic resonance imaging apparatus further comprising:
  a receiver channel and
  a switch configured for selectively connecting the receiver channel sequentially to the receiver coil of the active orthogonal pair.

14. A magnetic resonance imaging apparatus as claimed in claim 13, wherein each transmitter coil of each orthogonal pair generates a radio frequency pulse of different amplitude and phase from that generated by the transmitter coil(s) of the other orthogonal pair(s).

15. A rotary switched RF coil array arrangement configured for combined parallel magnetic resonance imaging of a subject located in a cylindrical imaging space in which a homogeneous static magnetic field is operatively applied in a first direction, the RF coil array arrangement comprising:
  a plurality of individual coil elements spaced angularly about the axis of the cylindrical imaging space, each individual coil element being electrically separate from each of the other individual coil elements and including
    a pair of main conductors extending axially on diametrically opposite sides of the cylindrical imaging space in a single plane, said single plane passing through the middle of the cylindrical imaging space; and
    a connection conductor connected between respective ends of the main conductors, said connection conductor being generally transverse to the first direction;
  a receiver channel; and
  a switch configured for selectively connecting the receiver channel sequentially to the individual coil elements of the RF coil array.

16. An RF coil array arrangement as claimed in claim 15, wherein the connection conductors are non-diametrical at an axial end of the cylindrical imaging space in order to permit access into the cylindrical imaging space at that axial end of the cylindrical imaging space.

* * * * *